United States Patent [19]

Shirasu

[11] Patent Number: 4,780,639
[45] Date of Patent: Oct. 25, 1988

[54] ELECTROSTRICTION EFFECT ELEMENT

[75] Inventor: Tetsuo Shirasu, Tokyo, Japan

[73] Assignee: NEC Corporation, Tokyo, Japan

[21] Appl. No.: 52,828

[22] Filed: May 22, 1987

[30] Foreign Application Priority Data

May 22, 1986 [JP] Japan .................................. 61-118756

[51] Int. Cl.⁴ ............................................. H01L 41/08
[52] U.S. Cl. ...................... 310/328; 310/358; 310/366
[58] Field of Search ............... 310/328, 331, 358, 359, 310/366, 369

[56] References Cited

U.S. PATENT DOCUMENTS

| | | | |
|---|---|---|---|
| 3,590,287 | 6/1971 | Berlincourt | 310/359 X |
| 3,836,794 | 9/1974 | Shimizu | 310/359 X |
| 4,469,976 | 9/1984 | Scott | 310/366 X |
| 4,523,121 | 6/1985 | Takahashi et al. | 310/359 X |
| 4,633,120 | 12/1986 | Sato et al. | 310/359 X |
| 4,649,313 | 3/1987 | Ogawa et al. | 310/328 X |
| 4,678,957 | 7/1987 | Marnden, Jr. | 310/358 X |

Primary Examiner—Mark O. Budd
Attorney, Agent, or Firm—Sughrue, Mion, Zinn, Macpeak & Seas

[57] ABSTRACT

An electrostriction effect element having a simplified construction through the provision of a relatively thick connection portion disposed between two actuator portions. The connection portion preferably has a thickness greater than that of the solder or lead wires which are provided to connect the overall element. As a result, soldering is considerably simplified. Additionally, protection portions may be added at opposite ends of the pillar of electrostrictive material, sandwiching the actuator portions and the connection portion. The protection portions also preferably have a thickness greater than that of any of the electrostrictive layers in the pillar. Still further, buffer layers may be provided between the connection portion and each of the actuator portions, and also between the actuator portions and the protection portions. These buffer layers also preferably have a thickness greater than that of any of the electrostrictive layers in the pillar material. The overall element may be rectangular or cylindrical in cross-section.

11 Claims, 2 Drawing Sheets

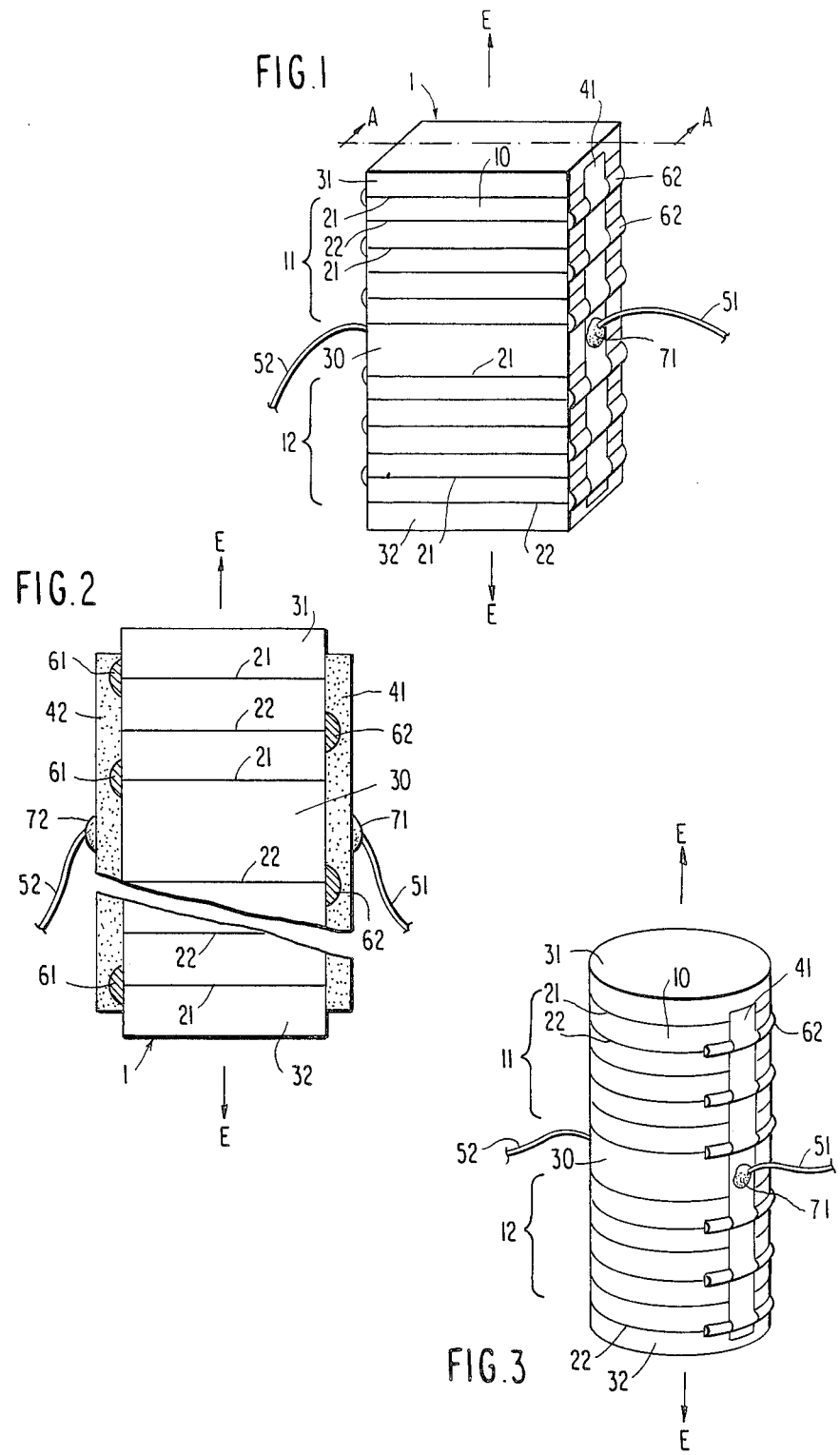

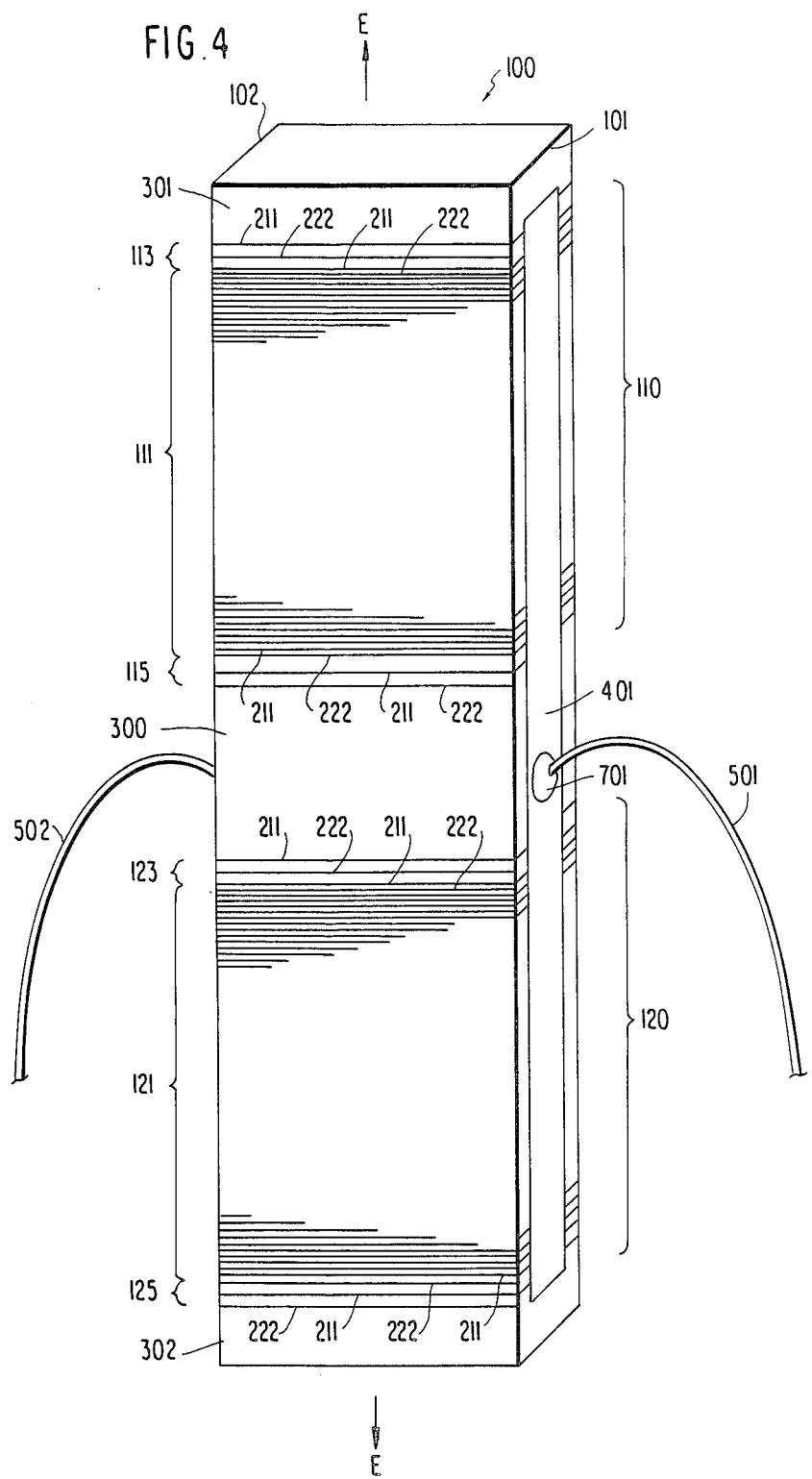

ELECTROSTRICTION EFFECT ELEMENT

BACKGROUND OF THE INVENTION

The present invention relates to an electrostriction effect element utilizing a known longitudinal electrostriction effect, and to an improved structure for particularly facilitating electrical connections between a pair of external electrodes of a multilayer piezoelectric actuator element and a pair of lead wires.

Such an actuator element is regarded as a substantial element in the field of mechatronic equipment as well as sensor elements. The actuator is a kind of transducer whereby electric energy is transduced into mechanical energy such as displacement or force. In U.S. Pat. No. 4,523,121 issued on June 11, 1985, a novel multilayer actuator element is proposed by the present applicant to improve a defect of short repetitional life prevailing on a prior art stacked type actuator, wherein a multiplicity of sintered piezoelectric plates were stacked on one another by using adhesive material.

In a newly proposed multilayer actuator, a plurality of green sheets of piezoelectric material with a conductive paste for an internal electrode formed on one side of the green sheet are laminated and sintered to form an integrated laminated structure. A first group of insulator belts are formed on every other end of the internal electrodes exposed to one of opposing side surfaces of the laminated structure, and a first external electrode layer is formed on exposed ends of the internal electrodes which are not covered by the first group of insulator belts, thus forming a first electrode group. A second group of insulator belts are also formed on the exposed ends of the internal electrodes which are not electrically connected to the first external electrode layer on the other of opposing side surfaces, and a second external electrode is formed thereon, thus forming a second electrode group. Then, a pair of lead wires are connected to the external electrodes on both sides. In such an electrostriction effect element, when a voltage is applied between the external electrodes through the lead wires, the applied voltage is provided on both ends of all the electrostriction sheets through the internal electrodes, and thus electrostriction is generated in the direction of lamination as the whole element.

Connecting portions between the lead wires and the external electrode layers are arbitrary. However, a general connection means such as solder or the like may involve the following problem. When the connecting portions are chosen at the upper end or the lower end of the external electrode layers in the direction of lamination, care should be taken such that since a metallic cap is mounted on both upper and lower portions of the actuator in many cases, solder may be applied erroneously on the metallic cap if a soldering position of the lead wire comes on the upper end or the lower end of the adtuator. As a result, excessive attention must be paid to the soldering process.

It is therefore preferable that the lead wire be soldered at the central portion of the external electrode layer. However, if each electrostriction layer is thinned, for example, to 250 μm or below, then there no longer will be sufficient space for the soldering process. Over soldering of the external electrode layer and rupture of the insulator due to a strain suppression effect of the solder may cause problems in reliability.

SUMMARY OF THE INVENTION

An object of the invention is to provide an electrostriction effect element to facilitate the connection between an external electrode provided on the element and lead wires.

The present invention is featured by an intermediate layer disposed in the pillar of a plurality of stacked electrostriction layers and internal electrodes inserted therebetween. The pillar is divided into two by the intermediate layer and a pair of external electrodes connected to the internal electrodes are extended to the exposed side surface of the intermediate layer where lead wires are bonded to the external electrode layers. The intermediate layer should have a thickness greater than each electrostriction layer so as to provide an area large enough for the lead wires to be bonded.

BRIEF DESCRIPTION OF THE DRAWINGS

FIG. 1 is a perspective view showing an electrostriction effect element according to a first embodiment of the invention.

FIG. 2 is a sectional view taken along the line A—A shown in FIG. 1.

FIG. 3 is a perspective view showing an electrostriction effect element according to a second embodiment of the invention.

FIG. 4 is a perspective view showing an electrostriction effect element according to a third embodiment of the invention.

DESCRIPTION OF THE PREFERRED EMBODIMENTS

Referring to FIG. 1 and FIG. 2, an electrostriction effect element 1 according to a first embodiment of this invention comprises a rectangular pillar of an electrostriction material. The pillar has an axis and a pair of pillar or axial ends. First and second internal electrodes 21 and 22 are alternatingly disposed in the pillar to divide the pillar into first and second actuator portions 11 and 12 of electrostriction layers stacked on one another along the axis, an intermediate connection layer 30 of the electrostriction material between said first and second actuator portions 11 and 12, and first and second protection or dummy layers 31 and 32 made of the electrostriction material and positioned between the respective actuator portions 11 and 12 and the respective axial ends. Each electrostriction layer of the actuator portions 11 and 12 is indicated at 10. Each internal electrode 21 or 22 has an area which is substantially equal to a cross-sectional area which the pillar or the respective actuator portions 11 and 12 has perpendicularly of the axis. The internal electrodes 21 and 22 have ends which are exposed onto said surfaces of the pillar or of the respective actuator portions 11 and 12. The intermediate connection layer 30 has a thickness larger than other electrostriction layers 10. The pillar therefore comprises the internal electrodes 21 and 22, a pair of protection layers 31 and 32, and an intermediate connection layer 30.

Belt-shaped insulating layers 61 and 62 are coated on each of those ends of the internal electrodes 21 and 22, respectively, which are exposed on opposing side surfaces of the pillar. First and second conductive layers 41 and 42 are formed on the opposing side surfaces to commonly cover the belt-shaped insulating layers 62 and 61 and exposed ends of the first and second internal electrodes 21 and 22. The first and second conductive layers 41 and 42 serve as the first and the second external electrodes. First and second lead wires 51 and 52 are connected to the first and second conductive layers 41 and 42, respectively, at the positions located on the side surfaces of the connection layer 30 by using a solder material 71 and 72.

In order to facilitate the soldering process, the thickness of the intermediate connection layer 30 should be larger than the diameter of the provided soldering material 71 and 72. The diameter of the soldering material 71 and 72 depends on the diameter of the wire leads 51 and 52, that is, in general, the diameter of the soldering material is two to three times of that of the each lead wire. Accordingly, it is preferable to choose the thickness of the intermediate connection layer 30 to be at least two times of the diameter of the lead wires to be employed.

When a voltage is supplied between the external electrodes 41 and 42, electric field are produced in the respective electrostriction layers 10 parallel to the axis of the pillar. The electric fields make the respective electrostriction layers 10 exhibit the longitudinal electrostriction effect of the electrostriction material. As a results, the electrostriction layers 10 are subjected to elongation strains, which are summed up into an axial elongation E of the pillar as depicted by arrows at each of the protection layers 31 and 32.

The pillar is manufactured in the manner known in the art except for selection of the thicker connection layer 30. More specifically, a slurry is prepared at first by dispersing a mixture of presintered powder of an electrostriction material and an organic binder in an organic solvent. A typical example of the electrostriction material is lead nickel-niobate Pb (Ni$_{\frac{1}{3}}$Nb$_{\frac{2}{3}}$) O$_3$. By using a film or layer forming technique such as a tape casting method generally used in manufacturing maltilayer ceramic capacitors, the slurry is formed into a green sheet about 250 $\mu$m thick for the electrostriction layers. The internal electrodes 21 and 22 are formed by using a screen printing technique. A conductor paste with a mixture of silver powder and palladium powder is screen printed to a thickness of about 10 $\mu$m on one principal surface of the green sheet for each of the electrostriction layers. After being cut into desired dimensions, a predetermined number of the green sheets with the conductor paste are stacked or laminated. A single green sheet without conductor paste is used to provide the top protection layer 31 without the conductor paste. The thick connection layer 30 is formed by laminating a desired number of the green sheets without conductor paste and the conductor paste is formed on the top surface of the laminated green sheets. The stacked green sheets in the order shown in FIG. 1 and FIG. 2, are hot pressed, and then sintered at a temperature of about 1,000° C. for two hours, and then the side is cut to keep end surfaces of the internal electrodes 21 and 22 exposed externally. After forming the belt-shaped insulating layers 61 and 62 made of glass or the like, silver paste for the first and second external electrodes 41 and 42 is provided by using a screen printing technique.

Turning to FIG. 3, a second embodiment of the invention represents the case where the pillar has a cylindrical cross-section. Since the basic structure and manufacturing process are same as the first embodiment shown in FIG. 1 and FIG. 2, the same portions are designated by the same reference number and further description is omitted.

In the aforementioned embodiments, the actuator element is a so called contact type. Therefore, the actuator should be attached to a certain body, such as load mass and base body, in practical use. An adhesive layer between the actuator and the certain body sometimes has a mechanical rupture while being driven. It is assumed that the rupture is caused by the stresses induced through a piezoelectric unstiffened effect. To this end, an improved actuator structure is proposed by the same applicant of the present invention is U.S. Pat. No. 4,633,120 issued on Dec. 30, 1986. In this improved electrostriction transducer or actuator element comprising first and second protection layers in which no electric fields are produced during operation, each of end electrostriction layers which are contiguous to the respective protection layers with pertinent ones of internal electrodes interposed, is given a greater thickness as compared with other or intermediate electrostriction layers to make the transducer have a long life and a high reliability owing to the buffer function of the inserted end electrostriction layers.

Referring to FIG. 4, the third embodiment of the present invention will be described in which the principle of the present invention is applied to the above described improved structure. The structure shown has first and second active portions 110 and 120 which are sandwiched between first and second protection layers 301 and 302 and a connection layer 300, respectively. The first active portion 110 comprises a first actuator portion 111 sandwiched between first and second buffer portions 113 and 115. The second active portion 121 comprises a second actuator portion 121 sandwiched between third and fourth buffer portions 123 and 125. Structural difference between the first embodiment shown in FIG. 1 and the third embodiment is nothing but the existence of four buffer portions. Each buffer portion comprises two electrostriction layers each of which is sandwiched between first and second internal electrodes 211 and 222. Each of two electrostriction layers for the buffer portions has a larger thickness than that of each electrostriction layer used for the actuator portions, thus causing a small electrostriction effect and thereby functioning as a buffer layer between the actuator portions and inactive portions such as the protection portions 301 and 302 and connection portion 300. The typical thickness of each electrostriction layer for the actuator portions 111 and 121 is 0.1 mm, and the thickness of each electrostriction layer for the buffer portions is 0.2 mm. The connection portion 300 has a thickness of 3 mm and thus causes little electrostriction effect even in the case that the connection portion 300 is sandwiched between the first and second internal electrodes 211 and 222. Each protection portion has the thickness of 0.5 mm or more, and is inactive piezoelectrically as the electric field cannot be applied thereto.

In the case of the actuator element 100 shown in FIG. 4 having the length or height of 20 mm, each of the first and second actuator portions 111 and 121 comprises 59 sheets of 0.1 mm thick electrostriction layer with an internal electrode, and each buffer portion comprises two sheets of 0.2 mm thick electrostriction layer with an internal electrode. When the connection portion 300 has the thickness of the 3 mm, each of protection portions 301 and 302 has the thickness of 1.8 mm. The desired thickness of each portion other than the first and second actuator portions 111 and 121 can be obtained by laminating the necessary number of common or uniform sheets without conductor paste, each of which may have a thickness of 0.1 mm.

A cross sectional size of the actuator element according to the third embodiment shown in FIG. 4 is 5 mm×5 mm. A pair of external electrodes are provided on first and second opposing side surface of the actuator element, respectively. A first external electrode 401 is connected to exposed ends of the first internal electrodes on the first side surface 101. Needless to say, ends of the second internal electrodes are covered by insulating material (not shown) on the first side surface as in the case of the first and second embodiments. Similarly, the second external electrode (not shown) is provided on the second side surface 102. A first lead wire 501 is soldered to the first external electrode 401 at the position located on the connection portion 300. In the same manner, a second lead wire 502 is soldered to the second external electrode at the position located on the connection portion 300. In the embodiment, since the connection portion 300 is sufficiently thick, a soldering work can be greatly facilitated to effect a construction ready for mass production.

The thickness of the connection portion is not to exert an influence on a necessary function of the actuator element. In view of the purpose of the present invention, it is preferable that the thickness of the connection portion be larger than a diameter of the soldering portion. Since the diameter of the lead wire varies from 0.2 mm to 0.9 mm, in general, the thickness of the connection portion or layer should be selected to be two times that to three times of the wire diameter. When the lead wire of 0.2 mm diameter is used, and the diameter of the soldering material is about 0.5 mm, thus the thickness of the connection portion or layer should be 0.5 mm or more.

In the third embodiment shown in FIG. 4, when 100 to 150 volts are applied between the first and second internal electrodes 211 and 222, the connection portion 300 itself does not show the electrostriction effect even if the the connection portion 300 is made of electrostriction material and is sandwiched between the first and second internal electrodes 211 and 222. When the thickness of the electrostriction material of the connection portion 300 is five times or more of that of each electrostriction layer of actuator portion 111 and 121, the connection portion 300 becomes an inactive layer due to weak electric field, thus the connection portion 300 is not needed to be sandwiched between the first and second internal electrodes 211 and 222, but may be sandwiched by either pair of first or second internal electrodes. When the connection portion 300 is an inactive layer, the reliability of hard connection such as soldering becomes high.

The above-described embodiments refer to a case where the intermediate connection portion or layer is provided at the center of the actuator element. However, placement of the connection portion is not necessarily limited to the center, and thus the connection portion may be provided anywhere between the actuator portions. Further, in case the lead wires are mounted at positions varying on sides opposite each other, or, for example, downward on one side and upward on the other side, two connection portions will be inserted at different level in a axial direction in the actuator portions.

As described above, according to the invention, a sufficient space for soldering can be easily provided by merely providing an inactive portion or layer at any selected position in the electrostriction effect element, and thus an oversoldering on the external electrodes does not become a significant problem. Furthermore, the rupture of the insulating layers due to strain suppression effect of a solder and other defects can be removed reasonably, thus providing a remarkable effect in enhancing reliability.

What is claimed is:

1. An electrostriction effect element comprising:
   a pillar of an electrostriction material having side walls parallel to an axis and top and bottom surfaces perpendicular to said axis.
   first and second groups of internal electrodes disposed in said pillar to divide said pillar into a plurality of electrostriction layers stacked on one another along said axis and having side ends exposed along said side walls.
   first and second external electrode layers connected respectively to said side ends of said first and second groups of internal electrodes for supplying a voltage to all of said internal electrodes to produce electric fields in said plurality of electrostriction layers parallel to said axis to produce an elongation of said pillar along said axis,
   an intermediate layer of said electrostriction material disposed in said pillar so as to divide the pillar into first and second portions, said intermediate layer having top and bottom surfaces perpendicular to said axis and having a thickness greater than a thickness of any of said electrostriction layers in said pillar of electrostriction material, said intermediate layer further having side walls flush with said side walls of said pillar, said first and second external electrode layers being extended onto different portions of the side walls of said intermediate layer, and
   first and second lead wires connected to said first and second external electrode layers, respectively, by soldering at locations on said side walls of said intermediate layer such that said soldering does not extend beyond said side walls of said intermediate layer.

2. An electrostriction effect element as claimed in claim 1, wherein said thickness of said intermediate layer is at least twice a diameter of said first and second lead wires.

3. An electrostriction effect element as claimed in claim 1, further comprising a first and a second protection layer provided on said top and bottom surfaces of said pillar.

4. An electrostriction effect element as claimed in claim 3, further comprising a first buffer layer disposed between said top surface of said pillar of electrostriction material and said first protection layer, a second buffer layer disposed between said bottom surface of said pillar and said second protection layer, a third buffer layer disposed between said intermediate layer and said first portion of said pillar, and a fourth buffer layer disposed between said intermediate layer and said second portion of said pillar, each of said buffer layers including a layer of electrostriction material having a thickness larger than that of any of said electrostriction layers in said pillar of electrostriction material.

5. An electrostriction effect element as claimed in claim 1, wherein said intermediate layer is made of the same material as said electrostriction material of said pillar and the thickness of said intermediate layer is at least five times the thickness of any of said electrostriction layers.

6. An electrostriction effect element as claimed in claim 1, wherein said element is rectangular with respect to a cross-section taken perpendicularly with respect to said axis.

7. An electrostriction effect element as claimed in claim 1, wherein said element is cylindrical with respect to a cross-section taken perpendicularly with respect to said axis.

8. An electrostriction effect element as claimed in claim 3, wherein each of said protection layers has a thickness greater than that of any of said electrostriction layers in said pillar of electrostriction material.

9. An electrostriction effect element comprising:
   a thick intermediate layer of an electrostriction material having top and bottom surfaces and a side surface;
   first and second internal electrodes provided on said top and bottom surfaces of said intermediate layer, respectively;
   first, second and third electrostriction layers of said electrostriction material provided on said first internal electrode above said top surface of said intermediate layer, each of said first, second and third electrostriction layers having substantially the same thickness which is smaller than the thickness of said intermediate layer and having substantially the same planar shape as that of said intermediate layer, side surfaces of said first, second and third electrostriction layers being substantially flush with the side surface of said intermediate layer;
   third and fourth internal electrodes provides between said first and second electrostriction layers and between said second and third electrostriction layers, respectively;
   fourth, fifth and sixth electrostriction layers of said electrostriction material provided on said second internal electrode below said bottom surface of said intermediate layer, each of said fourth, fifth and sixth electrostriction layers having substantially the same thickness which is smaller than the thickness of said intermediate layer and having substantially the same planar shape as that of said intermediate layer, side surfaces of said fourth, fifth and sixth electrostriction layers being substantially flush with the side surface of said intermediate layer;
   fifth and sixth internal electrodes provided between said fourth and fifth electrostriction layers and between said fifth and sixth electrostriction layers, respectively;
   a first elongated external electrode provided on first portions of the side surfaces of said third, second, first, intermediate, fourth, fifth and sixth electrostriction layers, said first elongated external electrode being electrically connected to said first, fourth and fifth internal electrodes by being contacted with end portions thereof;
   a second elongated external electrode provided on second portions of the side surfaces of said third, second, first, intermediate, fourth, fifth and sixth electrostriction layers that are opposed to said first portions of said side surfaces, said second elongated external electrode being electrically connected to said third, second and sixth internal electrodes by being contacted with end portions thereof;
   a first lead wire soldered to said first elongated external electrode at a location corresponding to said first portion of the side surface at said thick intermediate layer; and
   a second lead wire soldered to said second elongated external electrode at a location corresponding to said second portion of the side surface at said thick intermediate layer.

10. An electrostriction effect element as claimed in claim 9, further comprising a first buffer layer of said electrostriction material disposed between said first internal electrode and said first electrostriction layer, and a second buffer layer of said electrostriction material disposed between said second internal electrode and said fourth electrostriction layer, each of said first and second buffer layers having a thickness larger than that of any of said first through sixth electrostriction layers and smaller than that of said intermediate layer.

11. An electrostriction effect element comprising:
   a first layer of electrostriction material having a pair of opposing parallel first and second principal surfaces and a pair of opposing parallel first and second side surfaces which are perpendicular to said principal surfaces;
   first and second elongated external electrodes provided along said first and second side surfaces, respectively, each of said external electrodes extending beyond said side surfaces so as to expand in opposite directions perpendicular to said principal surfaces;
   first and second lead wires soldered to said first and second external electrodes, respectively, at first and second soldering portions positioned on said first and second side surfaces, respectively;
   a pair of first internal electrode layers sandwiching said first layer so as to cover said first and second opposing principal surfaces substantially completely, said first internal electrode layers being connected to said first and second external electrodes, respectively;
   a pair of second layers of said electrostriction material laminated on said pair of first internal electrode layers, respectively, so as to sandwich said first internal electrode layers between said first layer and said second layers, respectively, each of said second layers having a thickness smaller than that of said first layer;
   a pair of second internal electrode layers provided on said second layers, respectively, so as to sandwich said second layers between said first internal electrode layers and said second internal electrode layers, respectively, said second internal electrode layer being connected to said first and second external electrodes, respectively;
   a pair of multilayer structures of third layers of said electrostriction material laminated on said second internal electrode layers, respectively, so as to sandwich said second internal electrode layers between said second layers and said pair of multilayer structures, each of said third layers having a thickness smaller than those of said second layers;
   a plurality of third internal electrode layers each sandwiched between consecutive ones of said third layers, respectively, said third internal electrode layers being alternately connected to said first and second external electrodes, respectively;
   a pair of fourth internal electrode layers provided on said pair of multilayer structures so as to sandwich said pair of multilayer structures between said second internal electrode layers and said fourth internal electrode layers, respectively, said fourth internal electrode layers being connected to said first and second external electrodes, respectively;

a pair of fourth layers of said electrostriction material provided on said fourth internal electrode layers, respectively, so as to sandwich said fourth internal electrode layers between said pair of multilayer structures and said fourth layers, each of said other layers having a thickness larger than that of each of said third layers;

a pair of fifth internal electrode layers provided on said fourth layers so as to sandwich said fourth layers between said fourth internal electrode layers and said fifth internal electrode layers, said fifth internal electrodes being connected to said first and second external electrodes, respectively; and a pair of fifth layers provided on said fifth internal electrode layers, respectively, so as to sandwich said fifth internal electrode layers between said fourth layers and said fifth layers, each of said fifth layers having a thickness larger than that of each of said fourth layers

* * * * *

UNITED STATES PATENT AND TRADEMARK OFFICE
CERTIFICATE OF CORRECTION

PATENT NO. : 4,780,639

DATED : October 25, 1988

INVENTOR(S) : Tetsuo SHIRASU

It is certified that error appears in the above-identified patent and that said Letters Patent is hereby corrected as shown below:

COLUMN 1, LINE 59   Delete "adtuator" and insert --actuator--.

COLUMN 2, LINE 54   Delete "said" and insert --side--.

COLUMN 3, LINE 19   Delete "field" and insert --fields--.

Signed and Sealed this

Sixth Day of June, 1989

Attest:

DONALD J. QUIGG

*Attesting Officer*　　　　*Commissioner of Patents and Trademarks*